(12) United States Patent
Leib et al.

(10) Patent No.: US 10,954,591 B2
(45) Date of Patent: Mar. 23, 2021

(54) METHOD FOR PRODUCING A STRUCTURED COATING ON A SUBSTRATE, COATED SUBSTRATE, AND SEMI-FINISHED PRODUCT HAVING A COATED SUBSTRATE

(75) Inventors: Jürgen Leib, Neunkirchen am Brand (DE); Ulli Hansen, Berlin (DE); Simon Maus, Berlin (DE)

(73) Assignee: MSG LITHOGLAS AG, Berlin (DE)

( * ) Notice: Subject to any disclaimer, the term of this patent is extended or adjusted under 35 U.S.C. 154(b) by 120 days.

(21) Appl. No.: 13/386,642

(22) PCT Filed: Jul. 22, 2010

(86) PCT No.: PCT/DE2010/000856
§ 371 (c)(1),
(2), (4) Date: May 7, 2012

(87) PCT Pub. No.: WO2011/009444
PCT Pub. Date: Jan. 27, 2011

(65) Prior Publication Data
US 2012/0231212 A1 Sep. 13, 2012

(30) Foreign Application Priority Data
Jul. 23, 2009 (DE) .................. 10 2009 034 532

(51) Int. Cl.
*C23C 14/00* (2006.01)
*C23C 14/10* (2006.01)
(Continued)

(52) U.S. Cl.
CPC ............ *C23C 14/10* (2013.01); *C23C 14/081* (2013.01); *C23C 14/083* (2013.01); *C23C 14/30* (2013.01);
(Continued)

(58) Field of Classification Search
CPC .... H05K 2203/0582; H05K 2203/0548; C23C 14/5873; C23C 14/5846; C23C 14/28;
(Continued)

(56) References Cited

U.S. PATENT DOCUMENTS 4,514,437 A * 4/1985 Nath ................. C23C 14/32
118/50.1
4,764,244 A * 8/1988 Chitty et al. ............... 216/20
(Continued)

FOREIGN PATENT DOCUMENTS

CN 1647258 A 7/2005
CN 101090996 A 12/2007
(Continued)

OTHER PUBLICATIONS

WO2007031317 A2—google translation.*
(Continued)

*Primary Examiner* — Gordon Baldwin
*Assistant Examiner* — Mohammad Mayy
(74) *Attorney, Agent, or Firm* — Schmeiser, Olsen & Watts, LLP

(57) ABSTRACT

The invention relates to a method for producing a structured coating on a substrate, wherein the method comprises the following steps: providing a substrate having a surface to be coated and producing a structured coating on the surface of the substrate to be coated by depositing at least one evaporation coating material, namely aluminium oxide, silicon dioxide, silicon nitride, or titanium dioxide, on the surface of the substrate to be coated by means of thermal evaporation of the at least one evaporation coating material and using additive structuring. The invention further relates to a coated substrate and a semi-finished product having a coated substrate.

14 Claims, 14 Drawing Sheets

Figure 1:

(51) Int. Cl.
*H01L 23/498* (2006.01)
*C23C 14/08* (2006.01)
*G02B 6/132* (2006.01)
*H01L 21/48* (2006.01)
*C23C 14/30* (2006.01)

(52) U.S. Cl.
CPC .......... *G02B 6/132* (2013.01); *H01L 21/4846* (2013.01); *H01L 23/49894* (2013.01); *H01L 2924/0002* (2013.01); *H01L 2924/09701* (2013.01); *Y10T 428/24174* (2015.01); *Y10T 428/24802* (2015.01); *Y10T 428/24926* (2015.01)

(58) Field of Classification Search
CPC . C23C 14/421; C23C 14/081; C23C 14/0652; C23C 14/0617; C23C 14/044; C23C 14/042; C23C 14/021
See application file for complete search history.

(56) References Cited

U.S. PATENT DOCUMENTS

| | | | |
|---|---|---|---|
| 4,935,797 A * | 6/1990 | Jambotkar | 257/197 |
| 5,150,436 A * | 9/1992 | Jaeger et al. | 385/2 |
| 5,417,804 A * | 5/1995 | Nishihara | G02B 6/122 |
| | | | 216/101 |
| 5,483,095 A * | 1/1996 | Kagawa | H01L 31/0203 |
| | | | 250/338.1 |
| 5,614,248 A * | 3/1997 | Schiller et al. | 427/8 |
| 5,629,242 A * | 5/1997 | Nagashima et al. | 438/692 |
| 5,635,087 A * | 6/1997 | Schiller | C23C 14/10 |
| | | | 204/298.16 |
| 5,817,242 A * | 10/1998 | Biebuyck et al. | 216/41 |
| 5,846,649 A * | 12/1998 | Knapp | B05D 1/62 |
| | | | 428/334 |
| 5,925,259 A * | 7/1999 | Biebuyck et al. | 216/2 |
| 6,261,696 B1 * | 7/2001 | Biro | G02B 1/115 |
| | | | 428/426 |
| 6,372,646 B2 * | 4/2002 | Ohmi | 430/313 |
| 6,468,703 B1 | 10/2002 | Edlingger et al. | 430/7 |
| 6,746,880 B2 * | 6/2004 | Birner et al. | 438/10 |
| 6,844,244 B2 * | 1/2005 | Best et al. | 438/460 |
| 6,896,938 B2 | 5/2005 | Kastner et al. | |
| 7,253,113 B2 * | 8/2007 | Cheng | 438/703 |
| 7,326,446 B2 | 2/2008 | Mund et al. | |
| 7,704,683 B2 | 4/2010 | Wittenberg et al. | |
| 7,825,029 B2 | 11/2010 | Leib et al. | |
| 7,991,248 B2 * | 8/2011 | Matsuoka | G02B 6/12002 |
| | | | 385/129 |
| 2004/0048171 A1 | 3/2004 | Grabher et al. | |
| 2005/0157414 A1 | 7/2005 | Edlinger et al. | |
| 2005/0233503 A1 * | 10/2005 | Leib | B81C 1/00269 |
| | | | 438/127 |
| 2006/0012005 A1 | 1/2006 | Leib et al. | |
| 2006/0148156 A1 | 7/2006 | Gunter et al. | |
| 2006/0286448 A1 * | 12/2006 | Snyder | H01M 2/0275 |
| | | | 429/176 |
| 2007/0001549 A1 | 1/2007 | Kando | |
| 2007/0020451 A1 | 1/2007 | Padiyath et al. | |
| 2007/0063211 A1 | 3/2007 | Iwasaki | |
| 2008/0042292 A1 * | 2/2008 | Adkisson et al. | 257/773 |
| 2008/0248267 A1 | 10/2008 | Taylor | |
| 2009/0011217 A1 | 1/2009 | Ottermann et al. | |
| 2009/0097105 A1 | 4/2009 | Hart et al. | |
| 2011/0175487 A1 * | 7/2011 | Hansen et al. | 310/313 R |

FOREIGN PATENT DOCUMENTS

| | | |
|---|---|---|
| CN | 101228217 A | 7/2008 |
| CN | 101305111 A | 11/2008 |
| DE | 10222609 B4 | 7/2008 |
| EP | 0753842 A2 | 1/1997 |
| EP | 1724616 A2 | 6/2005 |
| GB | 1450508 | 9/1976 |
| JP | 52-99837 | 8/1977 |
| JP | 64-68470 | 3/1989 |
| JP | 05-83063 A | 4/1993 |
| JP | 6-77578 | 3/1994 |
| JP | 6-342110 | 12/1994 |
| JP | 8-68902 | 3/1996 |
| JP | 08-225398 A | 3/1996 |
| JP | 08-201591 A | 8/1996 |
| JP | 8-220304 | 8/1996 |
| JP | 09-46156 A | 2/1997 |
| JP | 9-314716 | 12/1997 |
| JP | 10-56350 A | 2/1998 |
| JP | 11-80935 | 3/1999 |
| JP | 2000199827 A | 7/2000 |
| JP | 2001-14649 A | 1/2001 |
| JP | 2001-271157 A | 10/2001 |
| JP | 2002504699 A | 2/2002 |
| JP | 2003-347612 A | 12/2003 |
| JP | 2004218047 A * | 8/2004 |
| JP | 2005-130341 A | 5/2005 |
| JP | 2005528782 A | 9/2005 |
| JP | 2006503976 A | 2/2006 |
| JP | 2006233259 A | 7/2006 |
| JP | 2006-279609 A | 10/2006 |
| JP | 2006-338983 A | 12/2006 |
| JP | 2007-335468 A | 12/2007 |
| JP | 2008-516263 A | 5/2008 |
| JP | 2008-153038 A | 7/2008 |
| JP | 2009051055 A | 3/2009 |
| JP | 2010206015 | 9/2010 |
| WO | 2002031214 A1 | 4/2002 |
| WO | 02/082645 A | 10/2002 |
| WO | 2005086345 A | 9/2005 |
| WO | 2007031317 A2 | 3/2007 |
| WO | 2007084785 A | 7/2007 |

OTHER PUBLICATIONS

"Al 20 3 Films for Integrated Optics", M. K. Smit and G. A. Acket, Thin Solid Films, 138 (1986) 171-181.*
"Ion-beam-assisted deposition of thin films", P. J. Martin, H. A. Macleod, R. P. Netterfield, C. G. Pacey, and W. G. Sainty, Applied Optics, vol. 22, pp. 178-184. (Year: 1983).*
International Search Report for PCT/DE2010/000856, dated Oct. 1, 2010, 8 pages.
International Standard ISO 695, Glass—Resistance to attack by a boiling aqueous solution of mixed alkali—Method of test and classification, dated May 15, 1991, 8 pages.
International Standard ISO 719, Glass—Hydrolytic resistance of glass grains at 98 C—Method of test and classifiction, dated Oct. 1, 1985, 8 pages.
International Standard ISO 9385, Glass and glass-ceramics—Knoop hardness test, dated May 1, 1990, 8 pages.
The State Intellectual Property Office of the People's Republic of China Search Report and First Office Action, directed to CN Patent Application No. 201080033380.9, dated May 17, 2013 , 8 pages.
International Preliminary Report on Patentability for PCT/DE2010/000856, dated Feb. 7, 2012, 9 pages.
The State Intellectual Property Office of the People's Republic of China Search Report and Second Office Action, directed to CN Patent Application No. 201080033380.9, dated Dec. 19, 2013, 10 pages.
Translation of Office Action from Japan Patent Office dated Feb. 12, 2014 for Patent Application No. 2011-519038, 7 pages.
Corresponding Japanese Patent Application No. Tokugan 2012-52904; Japanese Office Action dated Feb. 24, 2015; 9 pgs.
Japanese Office Action dated Jan. 30, 2018, Application No. 2016-086128.
Schiller, S. "Plasma-Activated High Rate Evaporation Using a Low Voltage Electron Beam System", Surface and Coatings Technology, 68/69 (1994) 788-793.

(56) References Cited

OTHER PUBLICATIONS

Chinese Office Action dated Jun. 5, 2018 for Application No. 201610182116.0.

* cited by examiner

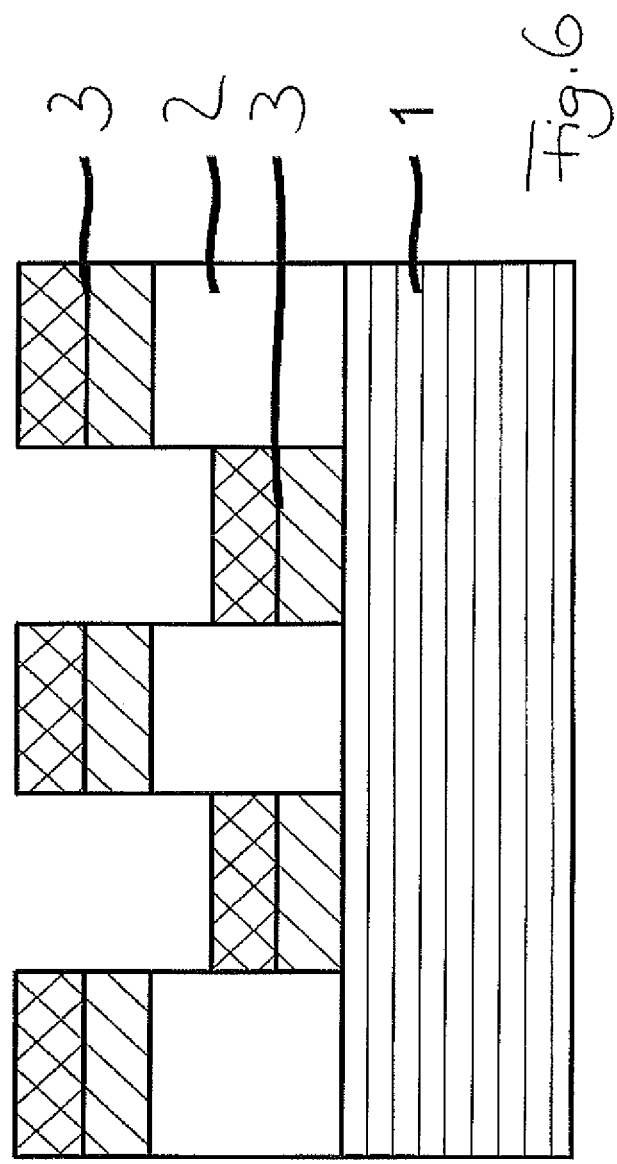

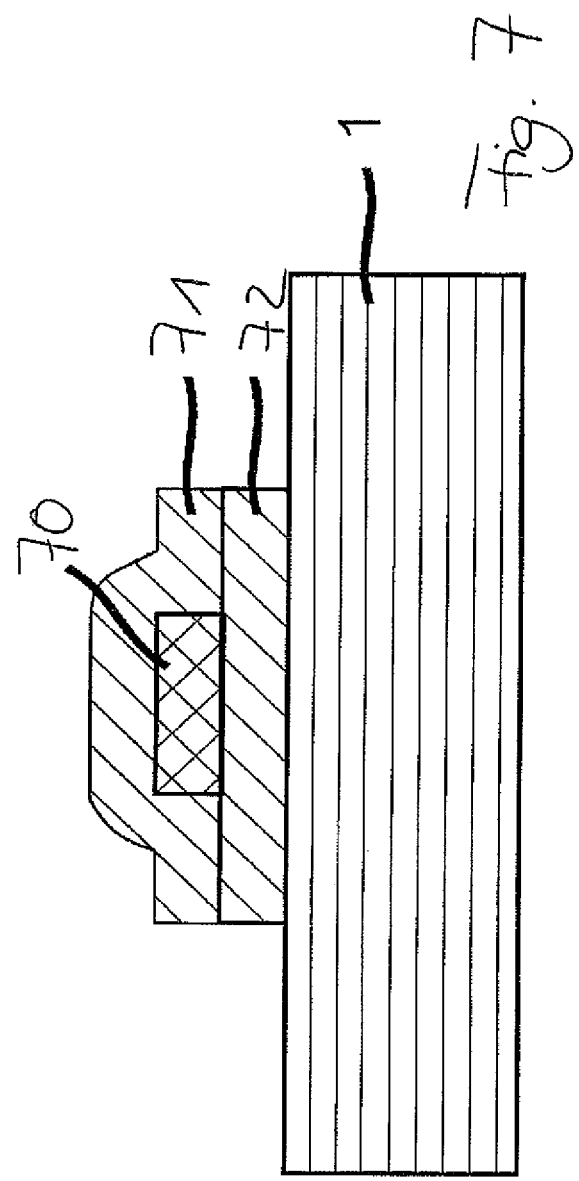

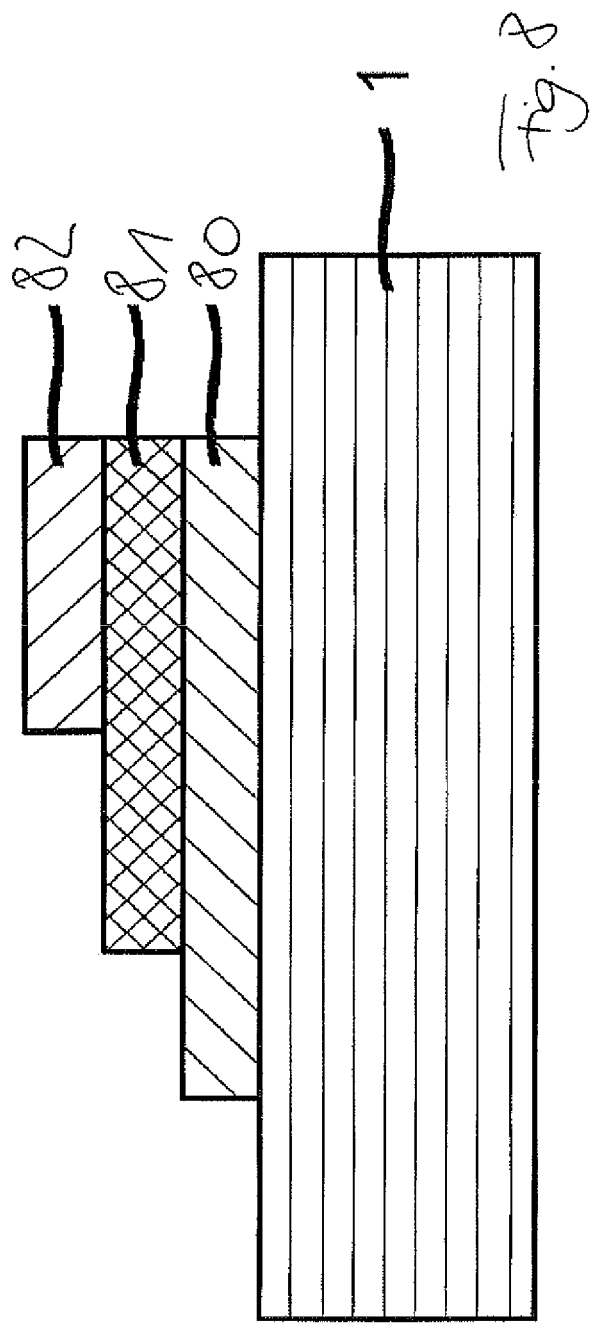

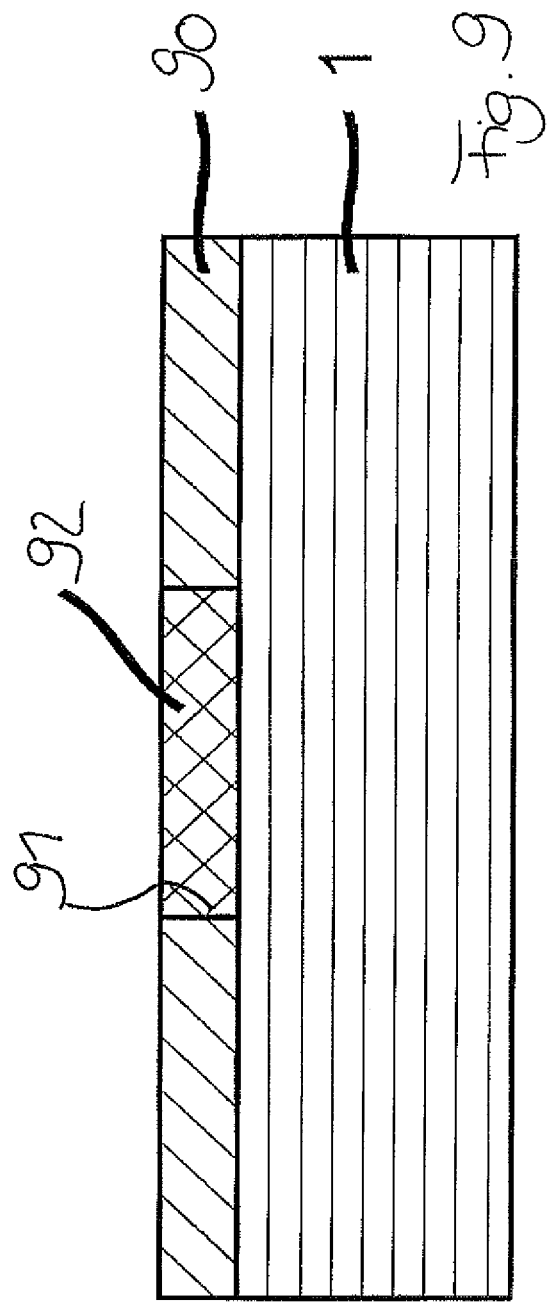

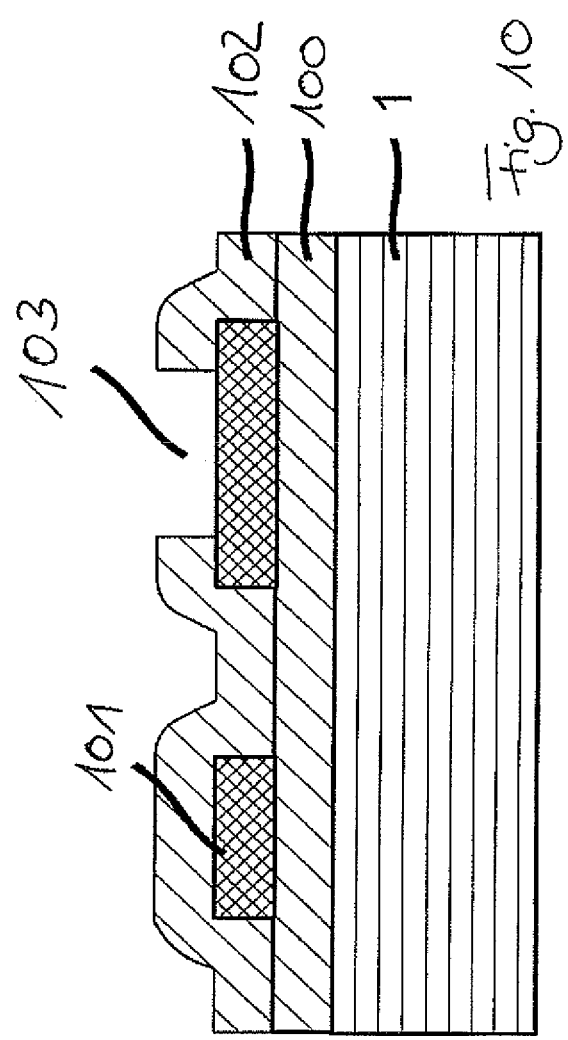

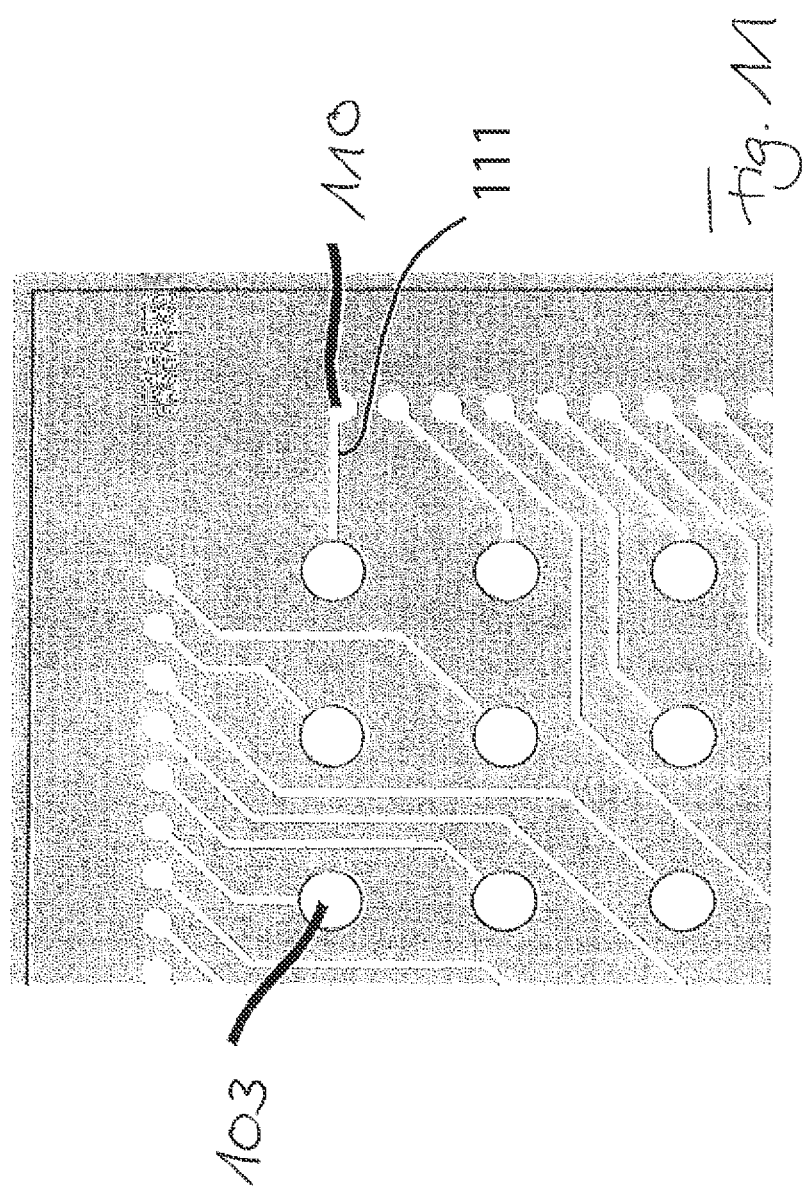

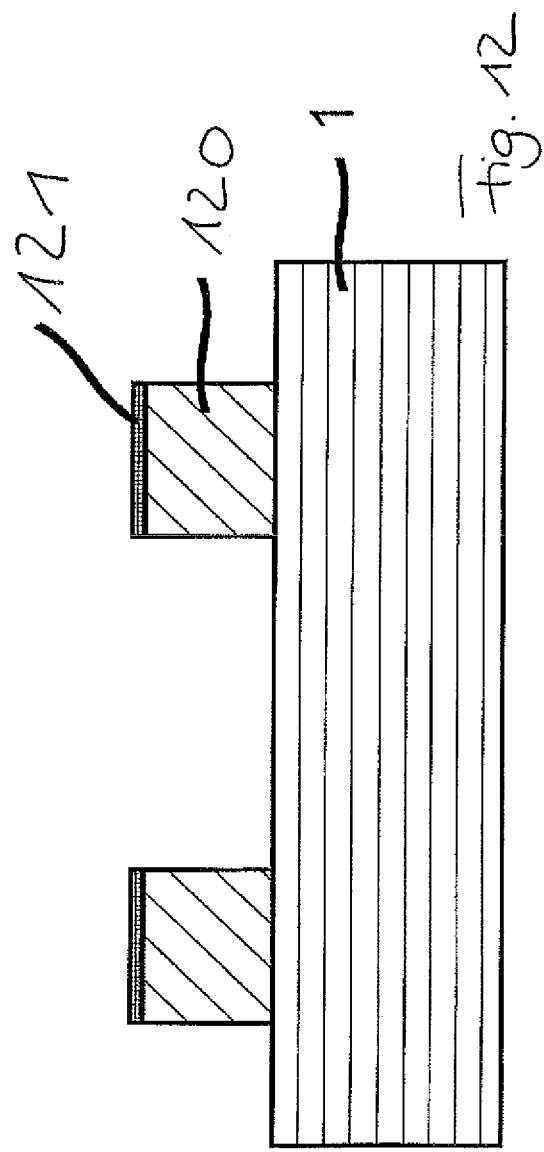

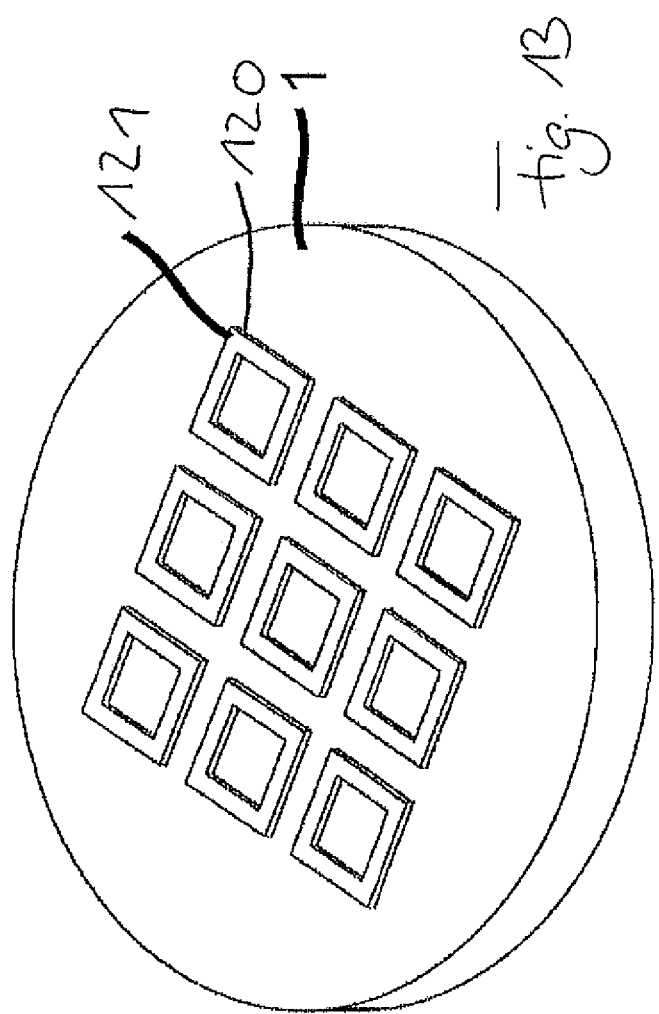

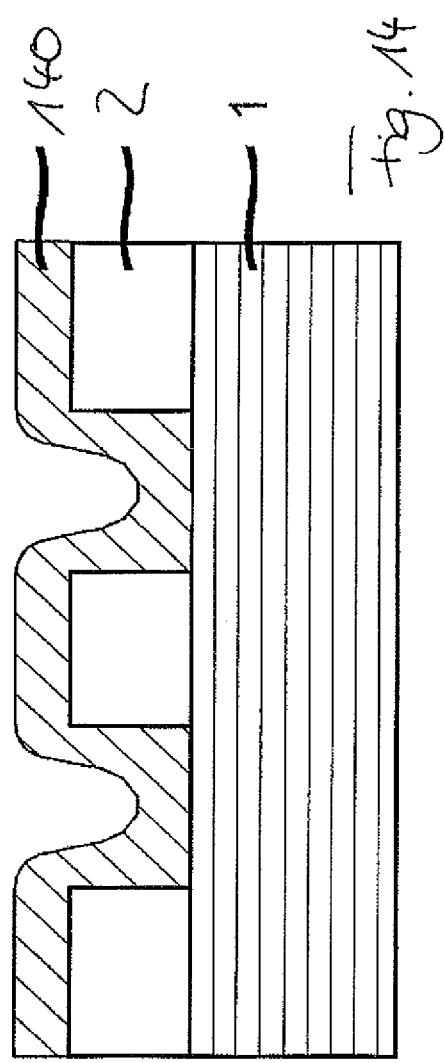

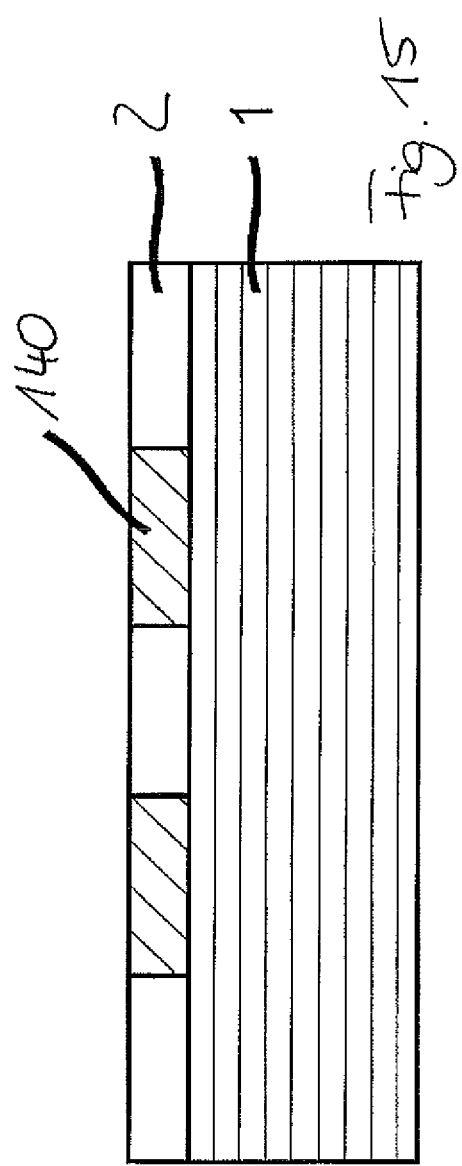

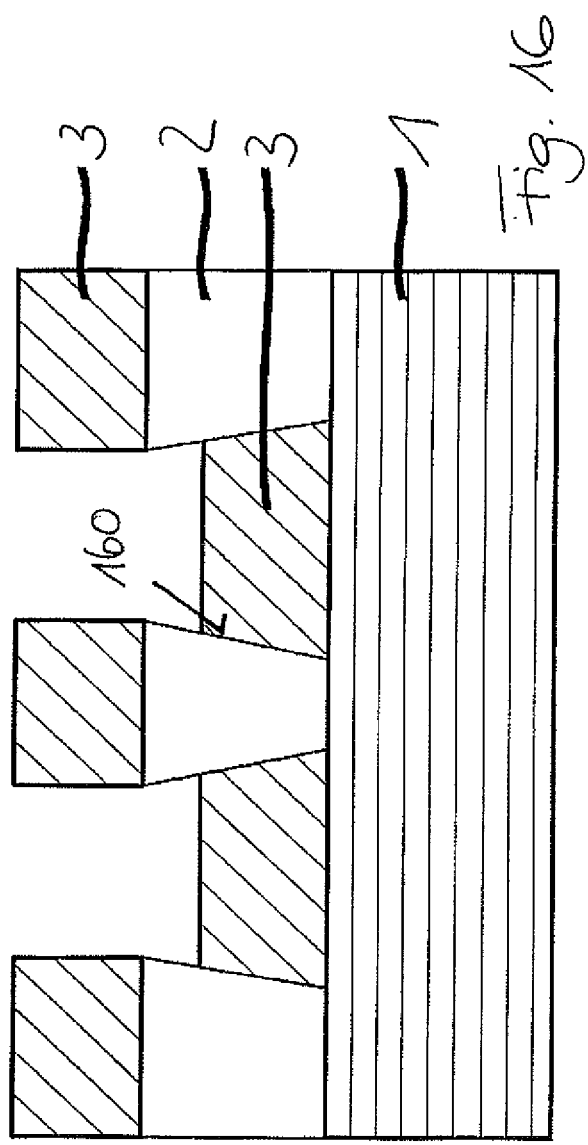

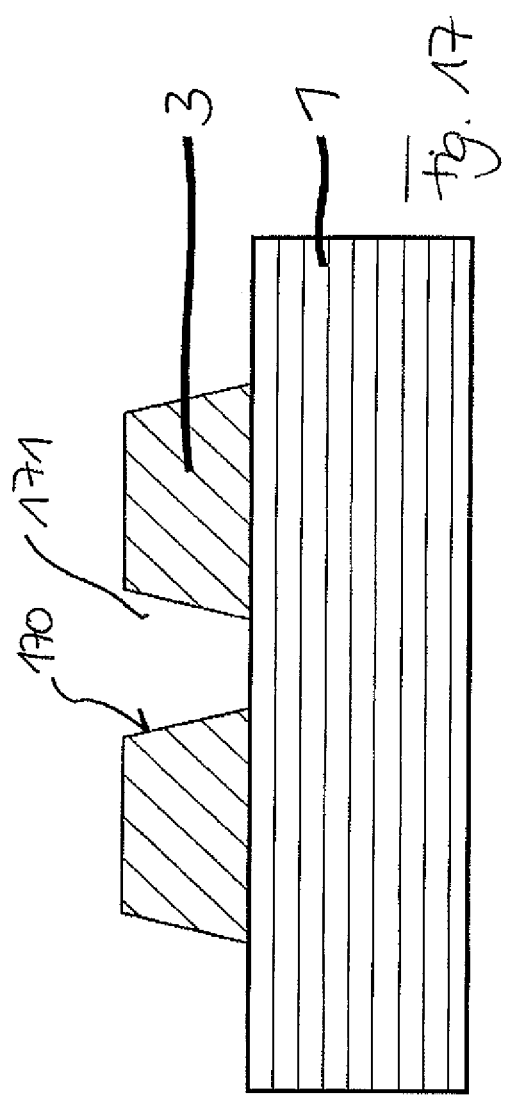

METHOD FOR PRODUCING A STRUCTURED COATING ON A SUBSTRATE, COATED SUBSTRATE, AND SEMI-FINISHED PRODUCT HAVING A COATED SUBSTRATE

BACKGROUND OF THE INVENTION

A method for producing a structured coating on a substrate surface which is to be coated is described in document DE 102 22 609 B4. The known process relates to a lift-off method in which a first layer with negative structuring is applied to the substrate surface to be coated. A second layer is then deposited on said surface, so that the first layer with the sections of the second layer located on it can finally be at least partially removed. The structured coating is produced with the known method by depositing the second layer, which comprises an evaporation glass material, by means of evaporation.

In addition to the known lift-off process, mask structuring can be used to produce a structured coating on a substrate, the structured coating being produced using one or more shadow masks. The shadow mask enables areas of the substrate to be kept free of the material being deposited.

The two aforementioned methods of forming a structured coating on a substrate are special characteristics of so-called additive structuring.

SUMMARY OF THE INVENTION

The problem addressed by the invention is to create improved technologies in connection with the production of a structured coating on a substrate.

This problem is solved according to the invention by a method for producing a structured coating on a surface to be coated, a coated substrate and a semi-finished product with a coated substrate.

According to one aspect of the invention, a method for producing a structured coating on a substrate is created, wherein the method comprises the following steps: providing a substrate having a surface to be coated and producing a structured coating on the surface of the substrate to be coated by depositing at least one evaporation coating material, namely aluminium oxide, silicon dioxide, silicon nitride or titanium dioxide, on the surface of the substrate to be coated by means of thermal evaporation of the at least one evaporation coating material and using additive structuring. The structured coating is completely or only partly produced by means of plasma-enhanced thermal electron beam evaporation.

A further aspect of the invention relates to a coated substrate, particularly one produced according to the preceding method, with a substrate in which a structured coating made up at least in part of at least one evaporation coating material, namely aluminium oxide, silicon dioxide, silicon nitride or titanium dioxide, is formed on a surface.

According to another aspect of the invention, a semi-finished product is created with a coated substrate, exhibiting a substrate, a first layer made up of at least one layer material on a surface of the substrate to be coated, wherein one or more sections of the surface to be coated are free from the first layer and a negative structure is formed on the surface with the first layer and a second layer made up of at least one evaporation coating material, namely aluminium oxide, silicon dioxide, silicon nitride or titanium dioxide, on the surface provided with the first layer.

With the help of the invention the opportunity is created to produce individually designed coatings for different applications in an efficient manner with structuring on a substrate, by depositing at least one evaporation coating material, namely aluminium oxide, silicon dioxide, silicon nitride or titanium dioxide. These materials enable configured substrate coatings to be provided for different applications.

Individual or combined benefits can be derived in conjunction with the different evaporation coating materials, so that various improvements are possible depending on the application and evaporation coating material used. Hence, evaporated layers of the single-component system silicon dioxide compared with layers of a similar thickness of evaporation glass material, which is used in the state of the art, have a higher optical transmission, particularly in the ultraviolet wavelength range. The breakdown voltage for silicon dioxide is also higher. Aluminium oxide is characterised by high scratch resistance and a high optical refraction index. It is not corroded by hydrofluoric acid, in particular. Titanium dioxide has a very high optical refraction index. Silicon nitride exhibits a high breakdown voltage and, in addition, has a high optical refraction index compared with evaporation glass.

Surprisingly, it has emerged that a structured coating is possible with the evaporation coating materials indicated by means of plasma-enhanced electron beam evaporation, although these single-component systems exhibit a significantly higher melting temperature compared with evaporation glass. Despite this fact, it was possible for disadvantages that can occur with excessive substrate temperatures to be avoided. While the melting temperature of borosilicate glass, which is used as the evaporation glass material, is around 1300° C., the following values emerge for the evaporation materials proposed here: silicon dioxide—roughly 1713° C., aluminium oxide—roughly 2050° C., titanium dioxide—roughly 1843° C. and silicon nitride—roughly 1900° C.

The use of plasma-enhanced thermal electron beam evaporation of the evaporation coating material facilitates improved layer deposition. The plasma-enhanced thermal evaporation can be individually changed to suit the required application, in order to create the required layer properties when producing the structured coating. With the help of plasma enhancement, the layer adhesion and intrinsic compressive or tensile stresses in the layer can be controlled and improved, for example. In addition, the stoichiometry of the evaporated layer can be influenced.

In the different embodiments of the invention, the structured coating may be executed as a single layer or as multiple layers. In a multiple-layered design, it may be provided that at least one partial layer of a first evaporation material and at least one further partial layer of another evaporation material are deposited. It may be provided, for example, that a first partial layer is formed from silicon dioxide, on which a layer of aluminium oxide is then formed.

In one embodiment, in addition to one or several partial layers of the coating, which are deposited by means of plasma-enhanced thermal electron beam evaporation, one or several further partial layers are formed using other production methods, such as sputtering or CVD (Chemical Vapour Deposition). These production methods can also be used when coating silicon nitride or silicon dioxide, for example. The one or more partial layers of the structured coating may be processed before and/or after the depositing of the one or several partial layers.

Plasma enhancement also promotes high quality of the vapour-deposited layer. Good compacting and therefore hermetic properties can be created as a result of this. Few defects occur due to the improved layer growth. The substrate to be coated needs not be preheated. This sort of coating is also referred to as IAD cold coating. A particular advantage in this case is the high deposition rate that can be achieved, which means that processing times can be optimised overall during production. In traditional evaporation processes, the substrates must undergo intense preheating to achieve high layer qualities. This leads to greater desorption of the condensed particles and therefore reduces the evaporation rate that can be achieved. Furthermore, plasma enhancement means that the vapour can be directed by means of the plasma beam, in order to achieve an anisotropic encounter of the vaporised particles on the substrate surface to be coated. The result of this is that layer deposition can be achieved without links. These are unwanted connections between different areas on the surface of the substrate to be coated.

In preferred process embodiments, one or more of the following process features may be provided. In one embodiment, the plasma-enhanced thermal electron beam evaporation takes place at evaporation rates of between roughly 20 nm/min and roughly 2 µm/min. It may be provided that oxygen, nitrogen and/or argon plasma is used. Alternatively or in addition, it may be provided that the process step for thermal evaporation is preceded by pretreatment for the activation and/or cleaning of the surface to be coated. Pretreatment may be carried out using plasma, particularly oxygen, nitrogen and/or argon plasma. The pretreatment preferably takes place in situ, in other words right in the coating machine prior to thermal evaporation.

In a practical embodiment of the invention, it may be provided that the step for the thermal evaporation of the at least one evaporation coating material comprises a step for the co-evaporation of at least two evaporation sources. By means of the co-evaporation of at least two evaporation sources, the same or different materials can be deposited.

One advantageous embodiment of the invention provides that the structured coating is produced vertically in one direction to the plane of the surface to be coated with a non-uniform material composition.

A development of the invention preferably provides that the production of a structured coating on the surface of the substrate to be coated is carried out multiple times.

In an advantageous embodiment of the invention, it may be provided that the structured coating is produced on at least two points of the substrate. The structured coating may be produced on the front and back of the substrate, for example. The structured layer deposition on the front and back may take place during simultaneous or consecutive deposition processes.

A development of the invention may provide that the substrate is connected to a further substrate. The further substrate may be a component of a structural element chosen from the following group of structural elements: semiconductor structural element, optoelectronic structural element and micro-electromechanical structural element.

A preferred development of the invention provides that structures of the structured coating are at least partly filled. An electrically conductive and/or a transparent material are used to at least partly fill the structured coating.

In a practical embodiment of the invention, it may be provided that at least one conductive area is produced on the substrate. One or more strip conductors may be produced on the surface to be coated and/or on the structured coating by means of the at least one conductive area.

An advantageous embodiment of the invention provides that a bond layer is formed on the structured coating. The bond layer comprises a seed layer, for example, for subsequent metallisation and/or an adhesive layer.

A development of the invention preferably provides that the structured coating is formed as a multi-layer coating. In one embodiment the multi-layer coating is formed from layers of silicon dioxide and an evaporation glass material or silicon dioxide and aluminium oxide, the partial layer of the evaporation glass material or the aluminium oxide forming a top layer on the silicon dioxide. In this context it may be provided that deposition technologies other than thermal evaporation are used to produce one or more partial layers. These include sputtering, for example.

In an advantageous embodiment of the invention, it may be provided that the structured coating is formed with a layer thickness of between roughly 0.05 µm and roughly 50 µm, preferably with a layer thickness of between roughly 0.1 µm and roughly 10 µm and furthermore preferably with a layer thickness of between roughly 0.5 µm and roughly 3 µm.

A development of the invention may provide that the substrate exhibits a maximum substrate temperature of roughly 120° C., preferably of roughly 100° C., during deposition of the at least one evaporation coating material on the surface to be coated. This low substrate temperature is particularly advantageous when coating temperature-sensitive materials, such as plastics and polymer films for example, resists for example, and also temperature-sensitive components such as III/V semiconductor photo-detectors, for example. Using plasma-enhanced thermal electron beam evaporation enables the layers produced to be sufficiently compacted in one embodiment, without this requiring subsequent annealing, as is routinely provided for in the state of the art.

A preferred development of the invention provides that a substrate is supplied as the substrate, which comprises at least one of the following materials: glass, metal, plastics, ceramics, inorganic insulator, dielectric and a semiconductor material. Silicon or gallium arsenide are examples of possible semiconductor materials.

In a practical embodiment of the invention, it may be provided that in the case of additive structuring at least one of the following structuring processes is carried out:
 mask structuring, in which the structured coating is produced using a shadow mask and
 structuring by means of negative structure, in which the production of the structured coating comprises the following steps:
  production of a first layer with negative structures on the substrate surface to be coated, in which at least one layer material is deposited on the substrate surface to be coated and one or more sections of the surface to be coated are exposed by removing the deposited layer material,
  deposition of a second layer of the at least one evaporation coating material on the surface of the substrate provided with the first layer by means of thermal evaporation of the at least one evaporation coating material and
  at least partial removal of the first layer.

Structuring by means of negative structures is also referred to as lift-off structuring or lift-off process. In one embodiment the step for the at least partial removal of the first layer comprises a step for planarising the coated surface. Furthermore, a step for mechanical removal by means of grinding and/or lapping and/or polishing, for example, may be provided in addition or as an alternative. In one embodiment the formation of the negative structures may provide a step for the structured printing of a first coating, particularly structured printing by means of screen-printing. The production of negative structures may comprise a step for lithographic structuring and/or lithographic grey scale structuring. In one embodiment, the negative structures may also involve a step for the application of a layer capable of photostructuring. In this context, a step for the application of a resist material may be provided. The step for negative structuring may involve a step for dissolving the deposited layer material in a solvent. In a development, the step for the at least partial removal of the first layer may comprise a step for wet-chemical and/or dry-chemical removal.

An advantageous embodiment of the invention provides that with structuring by means of negative structure, the second layer is produced as a non-closed layer with one or more accesses to the first layer.

A development of the invention preferably provides that with structuring by means of negative structure, the second layer undergoes after-treatment. The after-treatment is carried out by wet-chemical and/or dry-chemical means and/or by means of tempering and/or by means of CMP (Chemical Mechanical Polishing) and/or by means of a step for the electrical doping of the second layer, for example. In the case of electrical doping, at least one doping material is commonly embedded in a matrix material, in order to influence the layer's electrical properties.

A development of the invention may provide that with structuring by means of negative structure, the second layer is formed with obliquely reverting edge surfaces. The edge surfaces of the second layer are not then perpendicular to the layer beneath, but are inclined towards the second layer.

A preferred development of the invention provides that with structuring by means of negative structure, the first layer is at least partly produced from a photoresist material. Application of the photoresist material takes place in a coating step, which is carried out by means of spin-coating and/or spraying and/or electrodeposition and/or laminating, for example. In this context or also in embodiments in which no photoresist material is used, the step for the partial removal of the first layer may comprise a step for embossing or etching the first layer. In one embodiment application of the photoresist material may occur through the application of a photoresist film.

In one embodiment the first layer of the photoresist material is cross-linked (softbake) at a maximum temperature of roughly 150° C. A particularly gentle execution of the lift-off process is thereby facilitated.

In connection with the substrate coated according to the invention and the semi-finished product according to the invention, the comments made in relation to advantageous embodiments of the process for producing a structured coating on a substrate apply here accordingly.

Preferred embodiments of the coated substrate and/or of the semi-finished product provide one or several of the following features. The one or several layers deposited by means of plasma-enhanced thermal electron beam evaporation are preferably acid-resistant at least in accordance with Class 2 according to DIN 12116. Reference to DIN 12116 is made along the same lines. Thus the surface to be tested is boiled in hydrochloric acid (c 5.6 mol/l) for six hours. The weight loss is then determined in mg/100 cm$^2$. Class 2 exists when half the surface weight loss is over 0.7 mg/100 cm$^2$ after six hours and is maximum 1.5 mg/100 cm$^2$. Further preferred is Class 1, in which half the surface weight loss is maximum 0.7 mg/100 cm$^2$ after six hours.

Alternatively or in addition, base resistance in accordance with Class 2, further preferred in accordance with Class 1, according to DIN 52322 (ISO 695) is provided. Here, too, the reference is made along the same lines. To determine the base resistance, the surfaces are exposed to a boiling aqueous solution for three hours. The solution is made up of equal parts of sodium hydroxide (c=1 mol/l) and sodium carbonate (c=0.5 mol/l). The weight losses are determined. Class 2 exists if the surface weight loss after three hours is over 75 mg/100 cm$^2$ and is maximum 175 mg/100 cm$^2$. According to Class 1, the surface weight loss after three hours is maximum 75 mg/100 cm$^2$.

In one embodiment it is provided that the one or several layers deposited by means of plasma-enhanced thermal electron beam evaporation exhibit a hydrolytic resistance at least satisfying Class 2 according to DIN 12111 (ISO 719), preferably Class 1.

Alternatively or in addition to this, solvent resistance may also be formed. In a preferred embodiment, the layers deposited by means of plasma-enhanced thermal electron beam evaporation exhibit an internal layer stress of less than +500 MPa, wherein the plus symbol denotes compressive stress in the layer. An internal layer stress of between +200 MPa and +250 MPa and 20 MPa and +50 MPa is preferably produced, wherein the minus symbol denotes tensile stress in the layer.

In addition or alternatively, the layers may be scratch-resistant with a Knoop hardness of at least HK 0.1/20=400 in accordance with ISO 9385.

In one embodiment of the invention it is provided that the layers deposited by means of plasma-enhanced thermal electron beam evaporation adhere very well to silicon with lateral forces greater than 100 mN in a nanoindenter test using a 10 µm stylus.

The production method may be adapted to create one or more of the aforementioned layer properties.

DESCRIPTION OF PREFERRED EXEMPLARY EMBODIMENTS

Figure 2:
Figure 3:
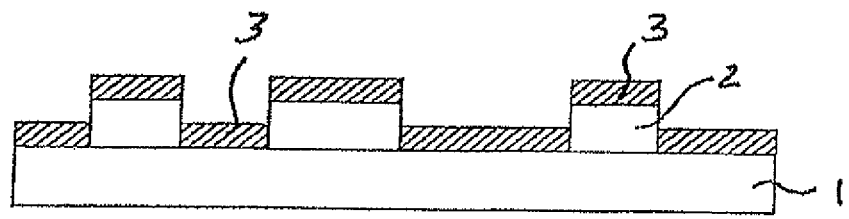
Figure 4:
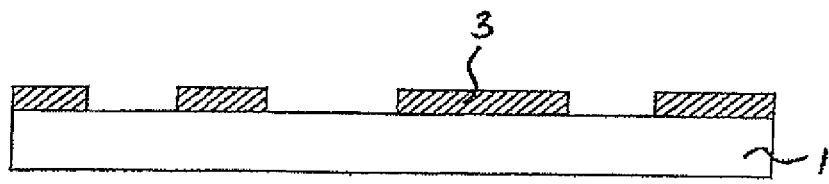
Figure 5:
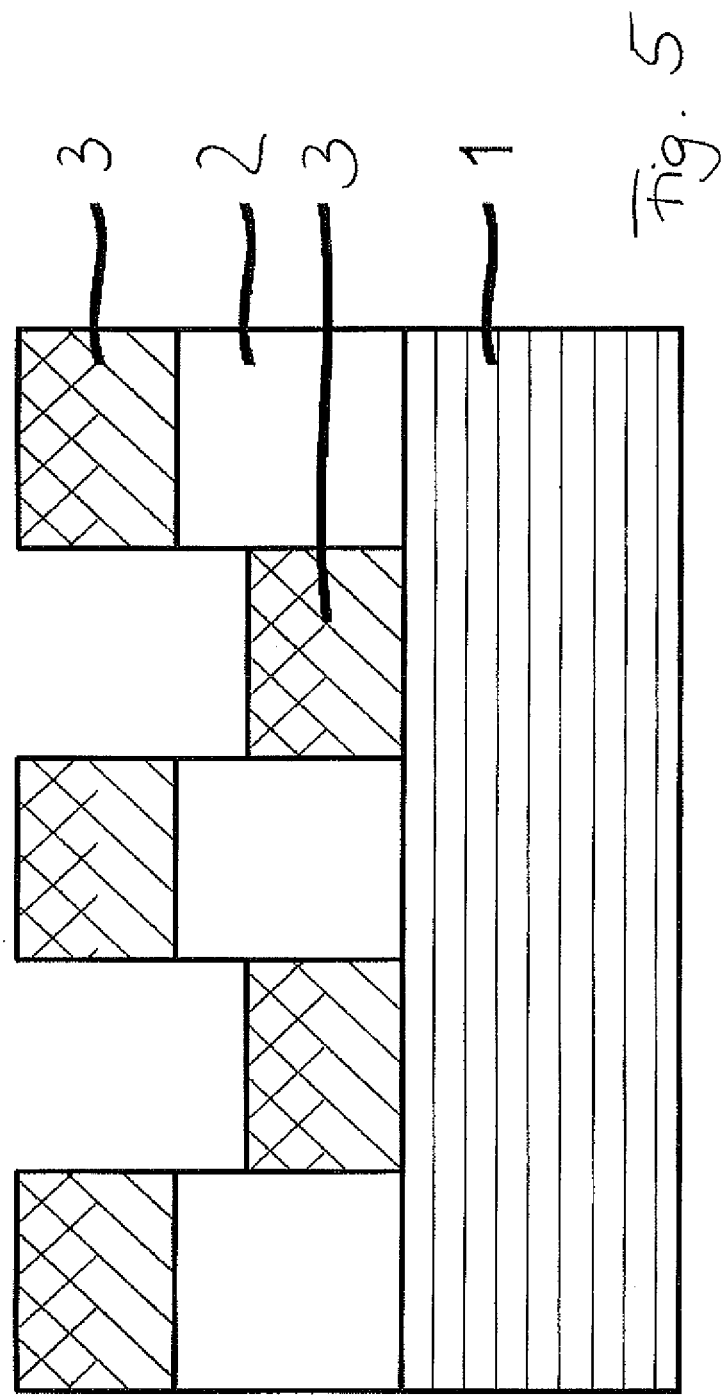

The invention is described in greater detail below using preferred exemplary embodiments with reference to figures in a drawing. In these:

FIG. 1 shows a schematic representation of a substrate on which a structured layer is to be deposited by means of plasma-enhanced thermal electron beam evaporation of an evaporation coating material, FIG. 2 shows a schematic representation of the substrate from FIG. 1 with resist deposited on it, which exhibits micro-structuring that corresponds to a negative image of the structured layer being deposited, said structuring being formed by means of lithography, FIG. 3 shows a schematic representation of the substrate from FIG. 2 with a layer of an evaporation coating material now deposited on it, FIG. 4 shows a schematic representation of the substrate from FIG. 3, wherein the resist has been removed, FIG. 5 shows a semi-finished product in which a layer of resist with a negative structure and an evaporated layer are formed on a substrate, FIG. 6 shows a further semi-finished product, in which a layer of resist with a negative structure and an evaporated layer are formed on a substrate, FIG. 7 shows a schematic representation of a configuration in which structured evaporation layers are formed on a substrate by means of multiple additive structuring, FIG. 8 shows a schematic representation of a configuration in which multiple evaporation layers are deposited by means of multiple additive structuring, FIG. 9 shows a schematic representation of a configuration in which a structured coating is formed on a substrate by means of additive structuring, wherein an intermediate section is provided with material filling in the structured coating, FIG. 10 shows a schematic representation of a configuration in which an unstructured and a structured evaporation layer are produced, FIG. 11 shows a schematic representation of a substrate section, FIG. 12 shows a schematic representation of a configuration in which an evaporated layer produced by means of additive structuring is formed on a substrate, which is provided with a bond/seed layer, FIG. 13 shows the configuration from FIG. 12 diagonally from above, FIG. 14 shows a schematic representation of a configuration in which the resist applied to a substrate with the negative image is completely enclosed by an evaporated layer, FIG. 15 shows the configuration according to FIG. 14 following mechanical planarisation, FIG. 16 shows a schematic representation of a configuration in which the edge surfaces of negative structures of a resist material run obliquely and FIG. 17 shows the configuration according to FIG. 16 following a lift-off process for detaching the resist material.

FIG. 1 shows a schematic representation of a substrate 1 on which a structured layer of an evaporation coating material, namely aluminium oxide, silicon dioxide, silicon nitride or titanium dioxide, is to be deposited by means of thermal evaporation, wherein plasma-enhanced electron beam evaporation is used. In the exemplary embodiment described here, the structured layer is produced with the help of a lift-off process described in greater detail below.

FIG. 2 shows a schematic representation of the substrate 1 from FIG. 1, on which a negative image of microstructuring required for the layer to be deposited is applied in a photoresist 2 by means of known lithography.

An evaporation coating material is then deposited by means of thermal evaporation, so that an evaporated layer 3 is produced in accordance with FIG. 3. In one embodiment, plasma-enhanced thermal electron beam evaporation is used in this case for layer deposition. The evaporated layer 3 is a single layer or multi-layered.

During deposition of the dielectric layer, the substrate 1 is held at a substrate temperature that is lower than roughly 120° C., preferably lower than roughly 100° C. Deposition of the evaporation coating material is enhanced by plasma, for which the process gases oxygen and argon are used, for example. In a preparatory step, the surface onto which the evaporation coating material is to be deposited is pre-cleaned or conditioned using plasma comprising argon and oxygen. During the different intervals of time involved in depositing layer 3, the plasma used has different settings, particularly with regard to its gas composition and the plasma output, in order to produce the desired layer properties in the evaporated layer.

FIG. 4 shows a schematic representation of the substrate 1 from FIG. 3, wherein the photoresist layer 2 is removed.

Further exemplary embodiments are explained below with reference to FIGS. 5 to 17. In this case, the same reference numbers are used for the same features as in FIGS. 1 to 4.

If the thermal evaporation is plasma-enhanced, a corresponding material and properties gradient can be achieved through the targeted variation of plasma parameters. Hence, for example, different compacting can be used within an evaporation coating material, so as to design the closing area hermetically, for example. The material and property gradient may be produced gradually in the form of a smooth transition (cf. FIG. 5) or abruptly by means of a sudden change in the evaporation material deposited, for example the application of a further material, which can also be deposited with the help of another process, or a sudden change in plasma parameters (FIG. 6). In this way, structured anti-reflex coatings can be produced by means of multiple applications of layers with different refraction indexes.

FIGS. 5 and 6 each show a semi-finished product in which the resist layer 2 with the negative structure and the evaporated layer 3 are formed on the substrate 1, said evaporation layer being formed with a gradual or smooth material transition (cf. FIG. 5) or a sudden material transition (cf. FIG. 6). In accordance with FIG. 3, the structured evaporation layer may be exposed with the help of a removal process.

FIG. 7 shows a schematic representation of a configuration in which structured evaporation layers 70, 71, 72 are formed on the substrate 1 by means of multiple additive structuring. A lift-off process was carried out multiple times. In one exemplary embodiment the structured layer 72 with a low optical refraction index is first deposited on the substrate 1, which is in an embodiment of silicon dioxide ($SiO_2$). Next follows the structured deposition of the evaporation layer 70 of an evaporation coating material, which has a higher optical refraction index than the evaporation coating material in layer 72, for example aluminium oxide ($Al_2O_3$). The vapour evaporation layer 71, for example of a material which has a lower optical refraction index than the evaporation material in the layer 70, for example silicon dioxide, is finally deposited by means of new structured deposition. The evaporation layer 70 is completely enclosed in this case, so that an optical waveguide can be formed, for example.

FIG. 8 shows a schematic representation of a configuration in which multiple evaporation layers 80, 81, 82 are deposited on the substrate 1 by means of multiple additive structuring, a structured coating thereby being formed. The multi-layered formation of the structured coating on the substrate 1 enables there to be multi-layered diffractive elements in one embodiment, for example. Of the plurality of evaporation layers 80, 81, 82, one, two or even all three evaporation layers may be made from the same material. It may also be provided, however, that two or even three different evaporation materials are used to produce the multiplicity of evaporation layers 80, 81, 82. In an alternative embodiment, it may be provided that one or two layers of the multi-layered coating are produced on the substrate 1 not by means of thermal evaporation but with the help of other production methods, for example sputtering or CVD. In addition, one of the multiple evaporation layers 80, 81, 82 may be a metallisation layer.

FIG. 9 shows a schematic representation of a configuration in which a structured coating 90 is formed on the substrate 1 by means of additive structuring, wherein an intermediate area 91 in the structured coating 90 is provided with a material filling 92, which is produced by deposition of an electrically conductive and/or optically transparent material, for example. A "buried" strip conductor made from an electrically conductive material can thereby be formed, for example. To achieve this, a thin seed layer made from TiW/Cu, for example, is applied to the structured coating 90 and in the intermediate area 91 by means of sputtering.

Following on from this, photoresist masking is carried out, which is freely structured over the intermediate area 91 to be filled. Next, copper is deposited up to the upper edge of the structured coating 90 in an electrogalvanic process. By exposing the masking and removing the seed layer on the structured coating 90, which is formed by means of thermal evaporation, the areas on the substrate 1 previously exposed, particularly the intermediate area 91, are filled with a copper strip conductor.

FIG. 10 shows a schematic representation of a configuration in which an unstructured evaporation layer 100 is produced on the substrate 1. Strip conductors 101 formed on this from an electrically conductive material are at least partly covered by means of a structured evaporation layer 102, which is produced with the help of additive structuring. Electrical contacting is possible via an opening 103 in the structured evaporation layer 102.

FIG. 11 shows a schematic representation of a substrate section, which shows how the electrical strip conductors in the configuration in FIG. 10 can be used for redistribution. Peripherally disposed contact pads 110 are wired across strip conductors 111 with larger, two-dimensional contact areas 112. The metal structures are applied to an unstructured base layer (cf. FIG. 10) and are covered by a layer which is only opened via the large contact areas 112. A configuration of this kind is advantageous particularly in conjunction with the flip-chip assembly of components.

FIG. 12 shows a schematic representation of a configuration in which an evaporated layer 120, to which a seed or bond layer 121 is applied, is formed on the substrate 1 by means of additive structuring. For example, the seed or bond layer may be an adhesive layer, with which the configuration with the substrate 1 is adhered to a further substrate (not shown). Hence, a closed cavity can be formed between a first substrate with a frame structure and a second substrate. This may be used, for example, to encapsulate optically active areas on the substrate 1.

A selective application of a seed layer to a frame structure of this kind may also be provided, the frame structure being made from copper, for example. When the two substrates are linked, the second substrate may have metallised areas made from tin, for example. The two substrates may then be joined by an eutectic bond. FIG. 13 shows the configuration in FIG. 12 diagonally from above.

FIG. 14 shows a schematic representation of a configuration in which the resist 2 applied with the negative image to the substrate 1 is completely enclosed by an evaporated layer 140. In a process step following this, the composite layer on the substrate 1 is planarised by means of mechanical processing, for example lapping, grinding and/or polishing. The result for mechanical working is shown in FIG. 15. By dissolving away the residual mask 2 the structured evaporation layer 140 can be exposed.

FIG. 16 shows a schematic representation of a configuration in which edge areas 160 of the negative structures of the resist material 2 run obliquely, so that in accordance with FIG. 17 edge areas 170 of the structured coating 3 are likewise formed obliquely, but with the reverse slant. The configuration according to FIG. 17 emerges as a result of the removal of the resist material 2. The edge areas 170 have a positive angle of bevel. A structured coating 3 designed in this manner is advantageous for subsequent metallisation, for example, in which one or more strip conductors (not shown) are guided via the edge areas 170.

In conjunction with the exemplary embodiments described above, reference was made to the additive structuring, which is optionally carried out by means of the lift-off process. Alternatively, additive structuring may be carried out using shadow mask technology. One or several masks are customarily used in this case to shadow areas on the substrate being coated, which are to remain free of the evaporation coating material. Multiple use for depositing multi-layered, structured coatings is also possible in conjunction with shadow mask technology.

The features of the invention disclosed in the preceding description, in the claims and in the drawing may be important both individually and also in any combination for the realisation of the invention in its different embodiments.

The invention claimed is:

1. A method comprising the following steps:
providing a substrate having a surface to be coated; and
depositing only a layer structure on the substrate, the layer structure consisting of three layers on the substrate, the three layers being a first layer deposited on the substrate, a second layer deposited on the first layer, and a third layer deposited on the second layer:
wherein each of the first layer, the second layer, and the third layer is formed by depositing a single evaporation coating material, such that the first layer, the second layer, and the third layer each comprise one evaporation coating material, the evaporation coating material comprising: aluminium oxide, silicon nitride, silicon dioxide, or titanium dioxide by means of thermal evaporation of the evaporation coating material; and
wherein the second layer is structured using a lift-off process and additive structuring on the deposited evaporation material, the second layer forming an optical waveguide;
wherein the thermal evaporation is carried out as plasma-enhanced thermal electron beam evaporation using oxygen, nitrogen, and/or argon;
wherein the evaporation coating material of the first layer has a refractive index which is lower than a refractive index of the evaporation coating material of the second layer, and
wherein the evaporation coating material of the third layer has a refractive index which is lower than the refractive index of the evaporation coating material of the second layer;
wherein, during evaporation of the three layers, a property gradient provided in a form of a gradual transition is generated at least one of: between the first layer and the second layer and between the second layer and the third layer.

2. The method according to claim 1, wherein the step for the thermal evaporation of the evaporation coating material comprises a step for the co-evaporation using at least two evaporation sources.

3. The method according to claim 1, wherein at least one conductive area is produced on the substrate.

4. The method according to claim 1, wherein the substrate exhibits a maximum substrate temperature of 120° C. during deposition of the at least one evaporation coating material.

5. The method according to claim 1, wherein the substrate comprises at least one of the following materials: glass, metal, plastics, ceramics, inorganic insulator, dielectric and a semiconductor material.

6. The method according to claim 1, wherein a layer thickness of the second layer is between 0.1 µm and 10 µm.

7. The method according to claim 6, wherein the layer thickness is between 0.5 µm and 3 µm.

8. The method according to claim 4, wherein the substrate exhibits a maximum substrate temperature of 100° C., during deposition of the at least one evaporation coating material.

9. The method of claim 1, wherein a pretreatment takes place in situ prior to the thermal evaporation.

10. The method of claim 1, wherein the first layer and/or the third layer are structured using additive structuring.

11. The method of claim 1, wherein the third layer is deposited on the second layer such that the second layer is enclosed by the first layer and the third layer.

12. The method of claim 1, wherein the first layer is made of silicon dioxide.

13. The method of claim 1, wherein the second layer is made of aluminium oxide.

14. The method of claim 1, wherein the third layer is made of silicon dioxide.

* * * * *